United States Patent
Mather-Neill et al.

(10) Patent No.: US 11,874,604 B2
(45) Date of Patent: Jan. 16, 2024

(54) METHOD OF CREATING A DESIGN ON A HELMET

(71) Applicants: Simon Mather-Neill, Santa Barbara, CA (US); Kimberly A Mather-Neill, Santa Barbara, CA (US)

(72) Inventors: Simon Mather-Neill, Santa Barbara, CA (US); Kimberly A Mather-Neill, Santa Barbara, CA (US)

(*) Notice: Subject to any disclaimer, the term of this patent is extended or adjusted under 35 U.S.C. 154(b) by 27 days.

(21) Appl. No.: 17/583,052

(22) Filed: Jan. 24, 2022

(65) Prior Publication Data

US 2022/0146941 A1  May 12, 2022

Related U.S. Application Data

(63) Continuation-in-part of application No. 17/347,304, filed on Jun. 14, 2021, now abandoned.

(Continued)

(51) Int. Cl.
*B05D 3/12* (2006.01)
*B05D 5/06* (2006.01)
(Continued)

(52) U.S. Cl.
CPC .............. *G03F 7/2002* (2013.01); *A42C 2/00* (2013.01); *B05D 3/12* (2013.01); *B05D 5/061* (2013.01); *B05D 7/57* (2013.01); *B24C 1/04* (2013.01)

(58) Field of Classification Search
CPC ............ B05D 3/12; B05D 5/061; B05D 7/57
See application file for complete search history.

(56) References Cited

U.S. PATENT DOCUMENTS

| | | | |
|---|---|---|---|
| 1,999,413 A | 8/1931 | Hemming | |
| 4,443,500 A | * 4/1984 | deJori | B44C 1/221 451/29 |

(Continued)

FOREIGN PATENT DOCUMENTS

| | | |
|---|---|---|
| WO | 2007018536 A1 | 2/2007 |
| WO | 2014204438 A1 | 12/2014 |

OTHER PUBLICATIONS

Marie Mulrooney. How to Paint Motorcycle Helmets. Jul. 25, 2017. https://www.ehow.com/how_4897184_paint-motorcycle-helmets.html (Year: 2017).*

(Continued)

*Primary Examiner* — Dah-Wei D. Yuan
*Assistant Examiner* — Kristen A Dagenais
(74) *Attorney, Agent, or Firm* — Guy Cumberbatch

(57) ABSTRACT

A method of creating a design on complex curves and irregular contours of a protective helmet, quickly and without having to first disassemble the helmet. A design is transferred to a clear film/acetate, which is then exposed onto a photoresist mask, transferring the design to the photoresist mask. The mask is washed out creating blast-able areas in the design mask. The mask is adhered to an area of the helmet, which is otherwise covered with a sealed protective bag. Sandblasting/abrasive-blasting etches portions of the helmet surface through the blast-able area of the mask. Various colors or other special effects may be painted/applied onto the etched portions of the helmet surface. The protective bag and photoresist mask can be removed, and the painted areas buffed/polished in a final step.

20 Claims, 8 Drawing Sheets

Related U.S. Application Data

(60) Provisional application No. 63/039,357, filed on Jun. 15, 2020.

(51) Int. Cl.
    *B05D 7/00*     (2006.01)
    *G03F 7/20*     (2006.01)
    *B24C 1/04*     (2006.01)
    *A42C 2/00*     (2006.01)

(56) References Cited

U.S. PATENT DOCUMENTS

| | | |
|---|---|---|
| 5,525,290 A | 6/1996 | Carpenter |
| 5,629,132 A * | 5/1997 | Suzuki .................. B24C 1/04 430/167 |
| 6,101,636 A | 8/2000 | Williams |
| 9,032,606 B2 | 5/2015 | Horkey |
| 2005/0028253 A1 | 2/2005 | Fowler |
| 2011/0088149 A1 | 4/2011 | Spinelli |

OTHER PUBLICATIONS

John Hogan. How to Clean Your Motorcycle Helmet. Jun. 20, 2013. https://www.visordown.com/features/guides/how-clean-your-motorcycle-helmet (Year: 2013).*

Home Improvement: Etching Glass, Home & Shop Journal, Popular Mechanics, Sep. 1993.

\* cited by examiner

FIG. 2
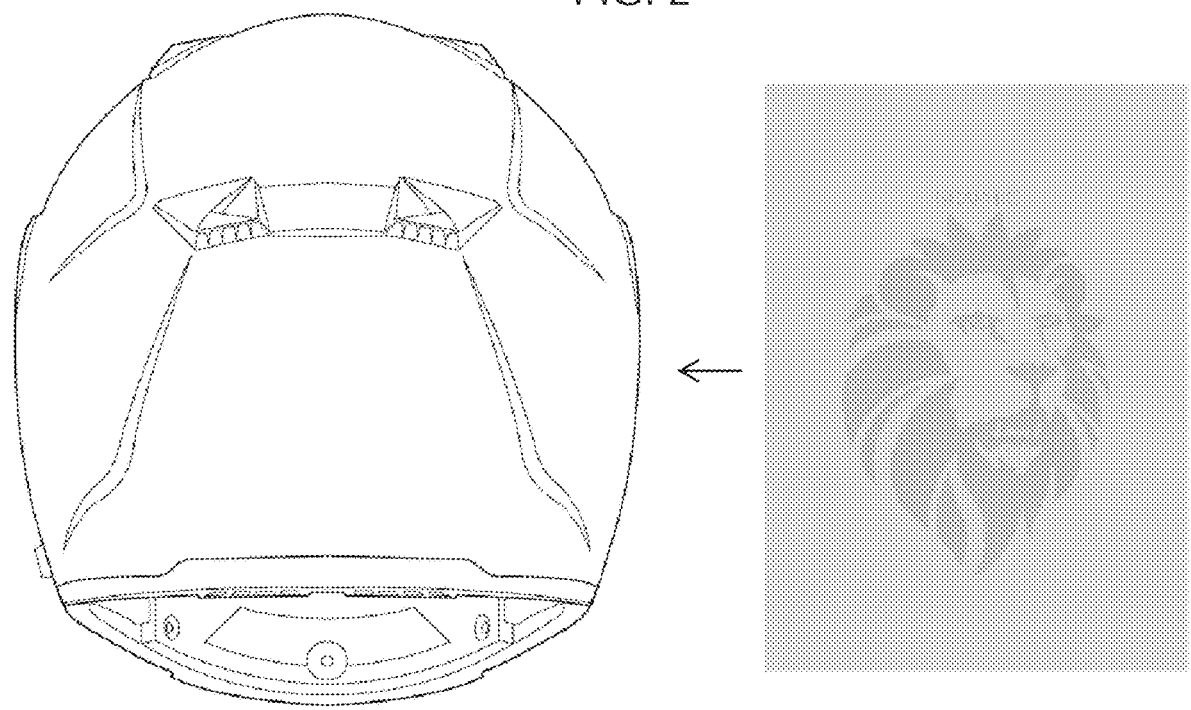
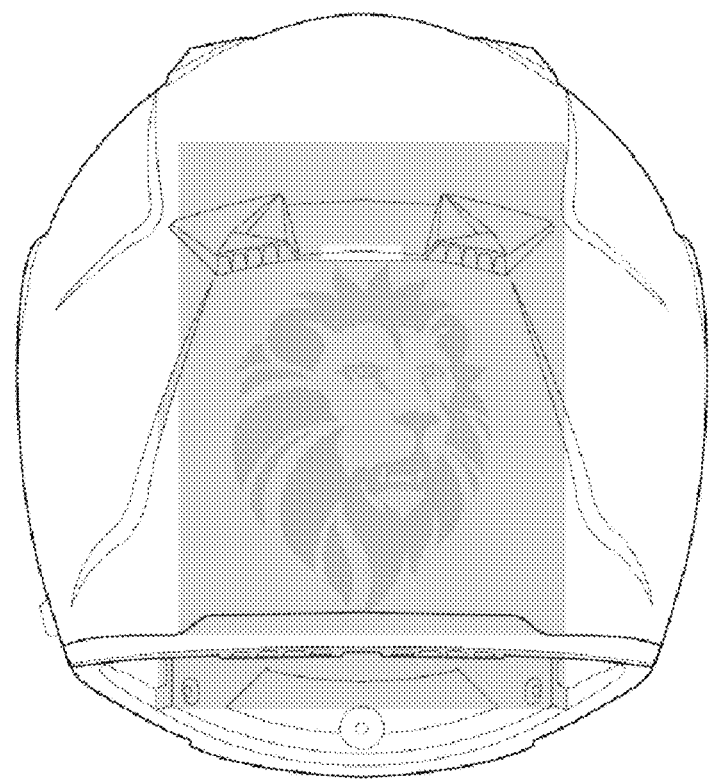
FIG. 3

METHOD OF CREATING A DESIGN ON A HELMET

RELATED APPLICATIONS

The present application is a continuation-in-part of U.S. application Ser. No. 17/347,304, filed Jun. 14, 2021, which claims priority under 35 U.S.C. § 119 to U.S. Provisional Application No. 63/039,357, filed Jun. 15, 2020, the disclosures of which are expressly incorporated herein.

FIELD OF THE INVENTION

The present invention is directed to decorating a motorcycle helmet (or sports helmet, e.g., baseball, football, snow, skate, bicycle, etc.), and more particularly to a method of economically creating custom and personalized designs on all types of protective helmets.

BACKGROUND OF THE INVENTION

Designs on motorcycle and other helmets are typically done during manufacturing and involve a process where a print is made, and applied to the helmet with water transfer method, for example, then the helmet receives a clear coat of lacquer to protect it.

This is all done on the outer shell prior to the helmet being assembled. This process makes custom designs highly uneconomical and individual changes to standard designs cannot be made.

The secondary way to apply a design on a helmet is to remove all trim, and hardware, sand the helmet down completely and then repaint it with a design and then again apply a clear coat of lacquer and then replacing all trim and hardware. This is a time-consuming and usually expensive method that also relies on the individual painter's skill rather than a printed process.

There remains a need for a more economical way to apply a design to a protective helmet which enables custom work without requiring the skill of an artisan every time.

SUMMARY OF THE INVENTION

It is an object of the present invention to provide methods of creating a design on complex curves and irregular contours of a helmet quickly and without having to disassemble the helmet.

A method of creating a design on complex curves and irregular contours of a protective helmet, quickly and without having to first disassemble the helmet. A design is transferred to a clear film/acetate, which is then exposed onto a photoresist mask, transferring the design to the photoresist mask. The mask is washed out creating blast-able areas in the design mask. The mask is adhered to an area of the helmet, which is otherwise covered with a sealed protective bag. Sandblasting/abrasive-blasting etches portions of the helmet surface through the blast-able area of the mask. Various colors or other special effects may be painted/applied onto the etched portions of the helmet surface. The protective bag and photoresist mask can be removed, and the painted areas buffed/polished in a final step. Thus, the helmet has had no dismantling, gluing, or otherwise potentially invasive work that could cause damage, add extra weight or compromise the safety and original factory build quality, very important as helmets are certified safety products from the manufacturer and any disassembly or assembly by non-qualified individuals would certainly void any warranties.

A further understanding of the nature and advantages of the invention will become apparent by reference to the remaining portions of the specification and drawings.

BRIEF DESCRIPTION OF THE DRAWINGS

Features and advantages of the present invention will become appreciated as the same become better understood with reference to the specification, claims, and appended drawings.

FIG. 2 is an elevational view of a backside of a motorcycle helmet adjacent a "mask" having a design of a lion printed on a photoresist film;

FIG. 3 shows the photoresist film of the mask adhered to the helmet;

DETAILED DESCRIPTION OF THE PREFERRED EMBODIMENTS

The present application is directed to methods of applying or creating a design on a cycle helmet; in particular, a motorcycle helmet. Of course, the present application can be utilized for any number of helmets, such as for bicycling, skiing, hockey, baseball, football, etc.

The process begins with creating a design either manually or on a computer with an illustrative program such as Adobe Illustrator. The design is then printed on a specialized clear sheet, preferably acetate. The clear sheet should be a UV approved clear film such as Inkjet film for inkjet printers Laser Film or UV Vellum for laser printers.

Figure 1:
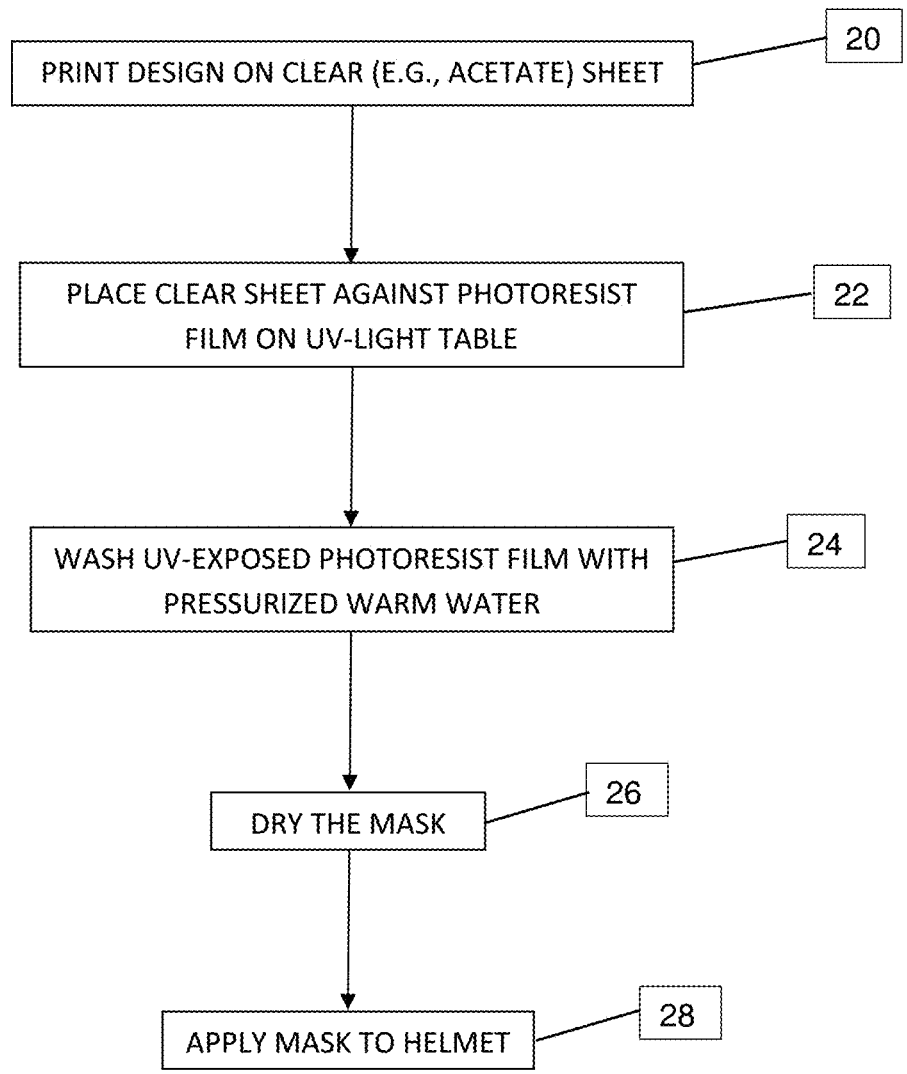
FIG. 1 is a flowchart showing an exemplary process for preparing a photoresist film mask.

FIG. 1 is a flowchart showing an exemplary process for preparing a photoresist film mask. In step 20, a design is imprinted on a clear sheet, such as acetate. The design may be initially drawn by hand and then copied to the clear sheet, or may be created using drawing software or other machine-enabled art program.

The next step at 22 is to expose the artwork design on the otherwise clear film print to a photoresist film using a UV light source. The film print will block the UV light from the photoresist film in the exact image of your artwork, but the areas that are exposed to the UV light will harden.

A photoresist (also known simply as a resist) film is a light-sensitive material used in several processes, such as photolithography and photoengraving, to form a patterned coating on a surface. A typical process begins by coating a substrate with a light-sensitive organic material. A patterned mask is then applied to the surface to block light, so that only unmasked regions of the material will be exposed to light. A solvent such as water is then applied to the surface. In the case of a positive photoresist, the photo-sensitive material is degraded by light and the developer will dissolve away the regions that were exposed to light, leaving behind a coating where the mask was placed. In the case of a negative photoresist, the photosensitive material is strengthened (either polymerized or cross-linked) by light, and the developer will dissolve away only the regions that were not exposed to light, leaving behind a coating in areas where the mask was not placed.

One particularly effective negative photoresist film for the processes disclosed herein is sold by Rayzist Photomask of Vista, CA.

In a preferred embodiment, the printed acetate film is then put together with a sheet of Rayzist Photomask photosensitive mask material to form a masking couple. The photoresist mask is quite bendable, stretches and has a self-adhesive. The layered masking couple of acetate with design and the photoresist mask material are placed in an UV Light exposure unit to "expose" the photosensitive mask material. Only those portions of the photosensitive mask material outside of the design on the acetate layer are affected. Namely, the photosensitive mask material outside of the design polymerizes and becomes water-insoluble.

Next is a washing step at 24. Once the photoresist film has been exposed to polymerize the UV exposed portions, the film is washed with pressurized warm water leaving a clear "blank" area to "blast" in. That is, the portions of the photosensitive mask material blocked from UV exposure by the design on the acetate layer remain water-soluble. The non-exposed areas, which are where the printed pattern blocked the UV light, will wash away, and one will be left with a photomask stencil of the custom design. The portion that does not wash out blocks (masks) the area for blasting.

The photoresist film made by Rayzist Photomask has a colored (blue) layer that washes away, though a thin clear layer remains. This backing layer enables isolated parts or "islands" of the design which otherwise are not connected to adjacent parts to remain in place.

The mask is then dried at step 26.

Once the photomask is dry, it can be applied to the helmet surface at 28, and the remainder of the process is ready to go. The photoresist mask is then positioned onto the helmet.

FIG. 2 schematically illustrates the backside of a helmet adjacent a "mask" with a design. The mask is a photoresist film mask. As any designer will understand, any desired image may be transferred to the photomask (or photoresist film).

FIG. 3 shows the photoresist film mask (shown in 2 darker shades for contrast) adhered to the helmet. The photoresist mask acts as a stencil or patterned mask allowing selected unmasked portions of the helmet to be removed (e.g., by sandblasting/abrasive-blasting) while other masked portions remain intact. Where the surface is covered with the photomask, it is completely protected from the corrosive impact of the abrasive. In the open areas of the photomask stencil, the surface is etched in the pattern of your computer-generated artwork. In the illustrated embodiment, the regions of the helmet under the darker portions of the photoresist mask are exposed and susceptible to abrasion, while the lighter colored regions are not.

The photoresist sheets are not only sticky on one side but they are quite stretchy and flexible in all directions so that they can hold to the helmet. Also, the adhesive does not leave any residue that might damage the helmet.

Figure 4:
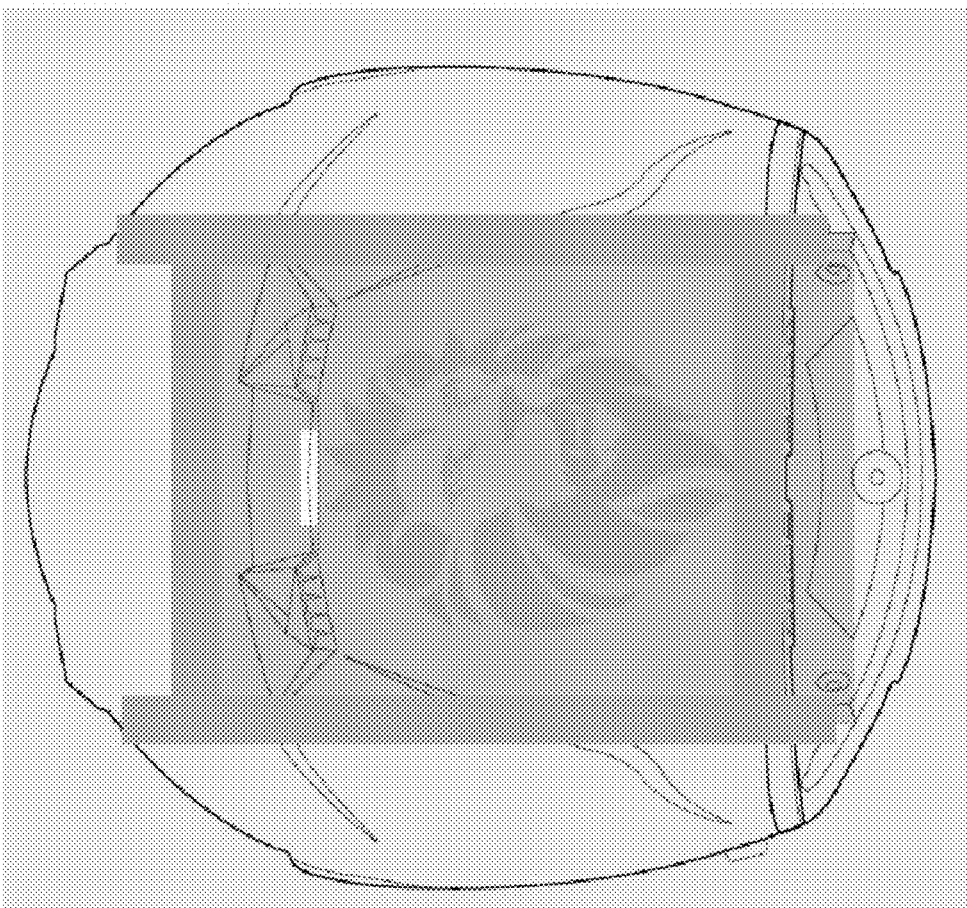
FIG. 4 shows the photoresist film taped to the helmet, and e helmet placed in thick plastic bag having the area above the mask cut out and taped.

FIG. 4 shows taping placed around the film, and then the helmet is placed in a sealed thick plastic protective bag with the film area cut out and taped. This protects other areas of the helmet with the bag, and only the area on which the photoresist mask has been applied is exposed. The helmet is masked everywhere so that none of the silica gets in the helmet or the vents etc.

Figure 5:
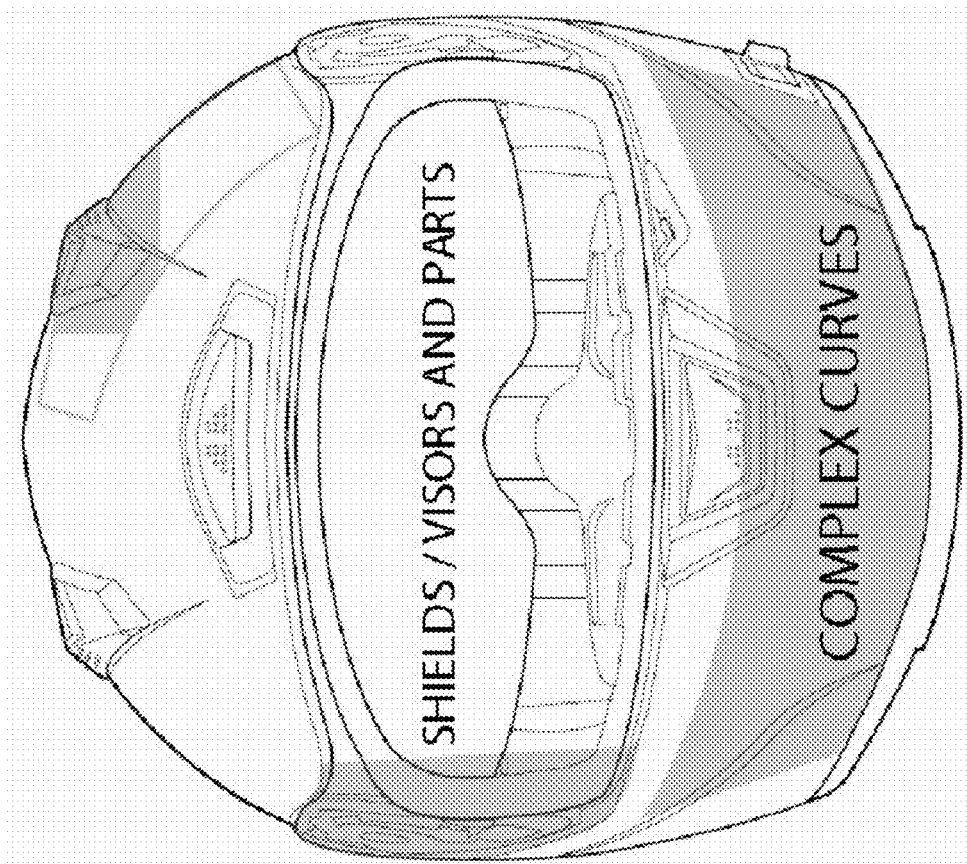
FIG. 5 illustrates a photoresist mask applied to complex curves, vents and shield of the helmet.

FIG. 5 shows that the photoresist mask can be used on complex curves, vents, and the shield. Since a helmet is a complex curved surface, an appropriate material that can stretch and curve and stick is necessary.

Figure 6:
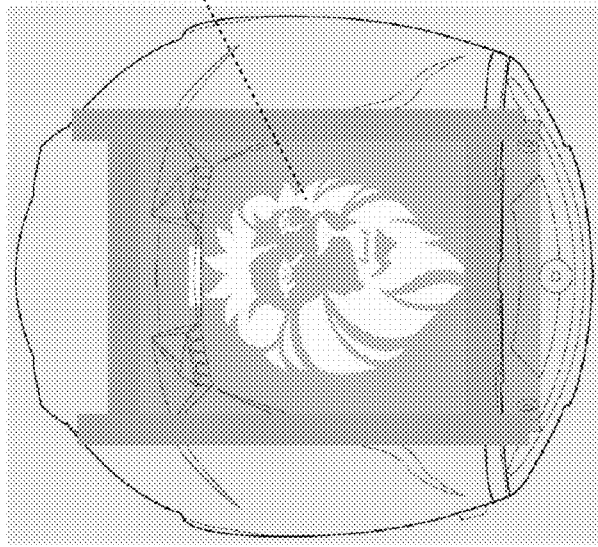
FIG. 6 schematically illustrates a sandblaster abrading portions of a topcoat paint layer of the helmet only within areas not covered by the photoresist mask.

FIG. 6 illustrates an abrasion phase. Recessed portions are formed by a sandblasting process. Abrasion is only into the clear topcoat and paint layer if required of the helmet through the "blank" areas of the photoresist mask that do not protect the helmet. The sandblasting gun is controllable to etch down to specific depths from a few microns to millimeters. A shallower abrasion may be required for a subtle design in the helmet. Color may also be added into the etching process including metallic particles, flakes, and chrome effect. Or a matte or shiny clear coat may be applied to achieve matte design on a gloss helmet or vice versa. The thin backing layer of clear film that remains from the washing step is also removed during the sandblasting step.

The sandblasting is done in a booth that can use any pressure and flow of any abrasive material required. A suitable sandblasting machine is a Guyson SBP40 model 6.

Figure 7:
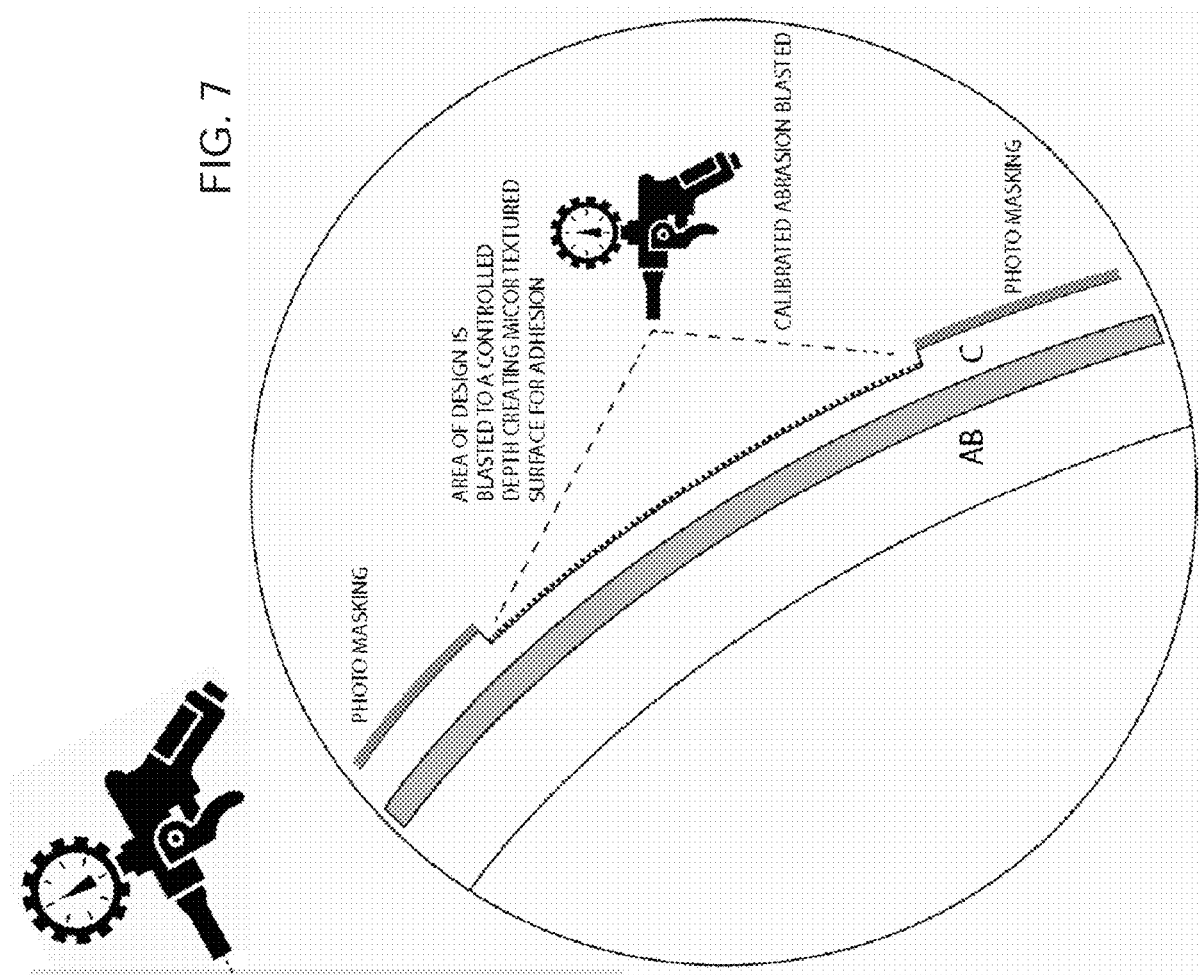
FIG. 7 is a close-up sectional view of the paint layer being removed with sandblasting.

FIG. 7 indicates in cross-section a close-up view of the paint layer that is removed with sandblasting.

In addition to using a photo resist film as described, the process of sandblasting/abrasive blasting a design into the clear coat and possibly the paint of a helmet can also be achieved by utilizing stencils made from self-adhesive vinyl for larger, simpler areas that do not require the minute detail.

Figure 8:
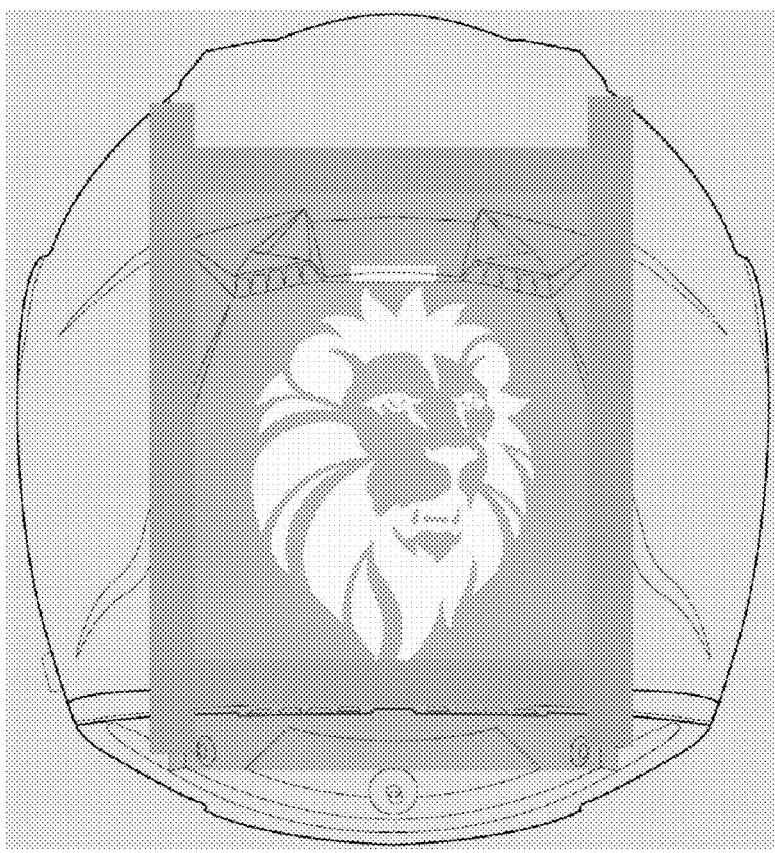
FIG. 8 schematically illustrates a cleaning phase after abrasion of the topcoat paint layer using compressed air.

FIG. 8 schematically illustrates a cleaning phase. After the mask is sandblasted, compressed air is used to remove any dust and debris from around the helmet and masking. The area that has been sandblasted is then wiped and degreased to be ready for color application.

Figure 9:
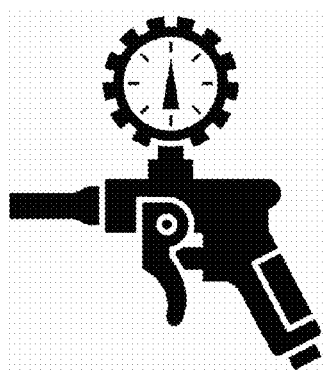
FIG. 9 illustrates application of a bonding agent layer to the masked area.
Figure 9:
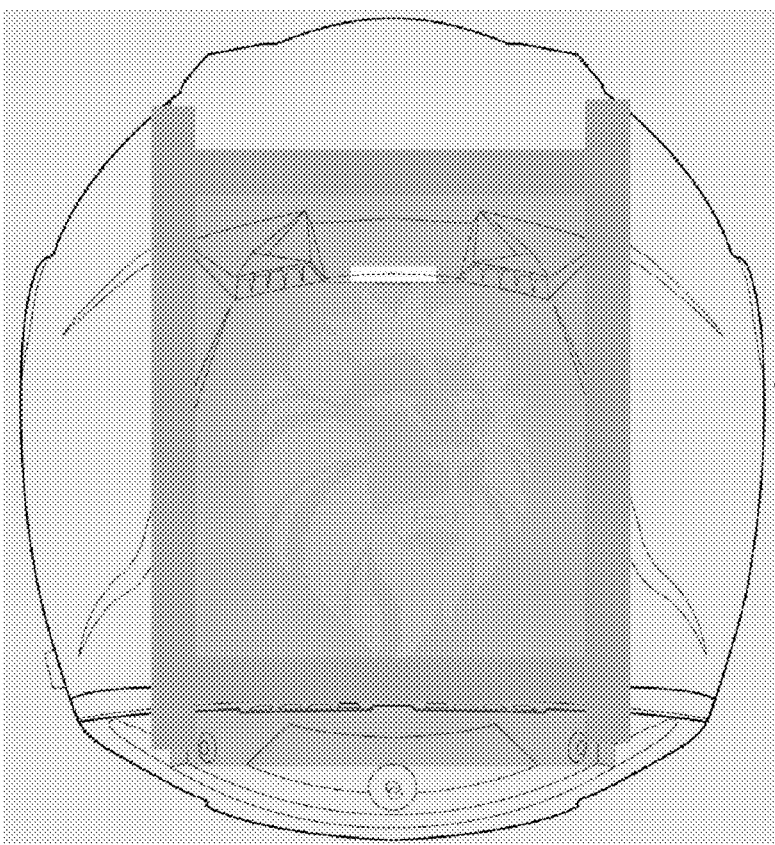

Subsequently, in FIG. 9, a bonding agent is applied. One layer of bonding agent is lightly applied to the "blank" areas of the mask, as painters will understand. One particular bonding agent that may be used is a paint solvent, a reducer, which melts any remaining paint within the etched areas and facilitates adherence of later paint layers. The paint is applied while the bonding agent is still wet, not dry.

Figure 10:
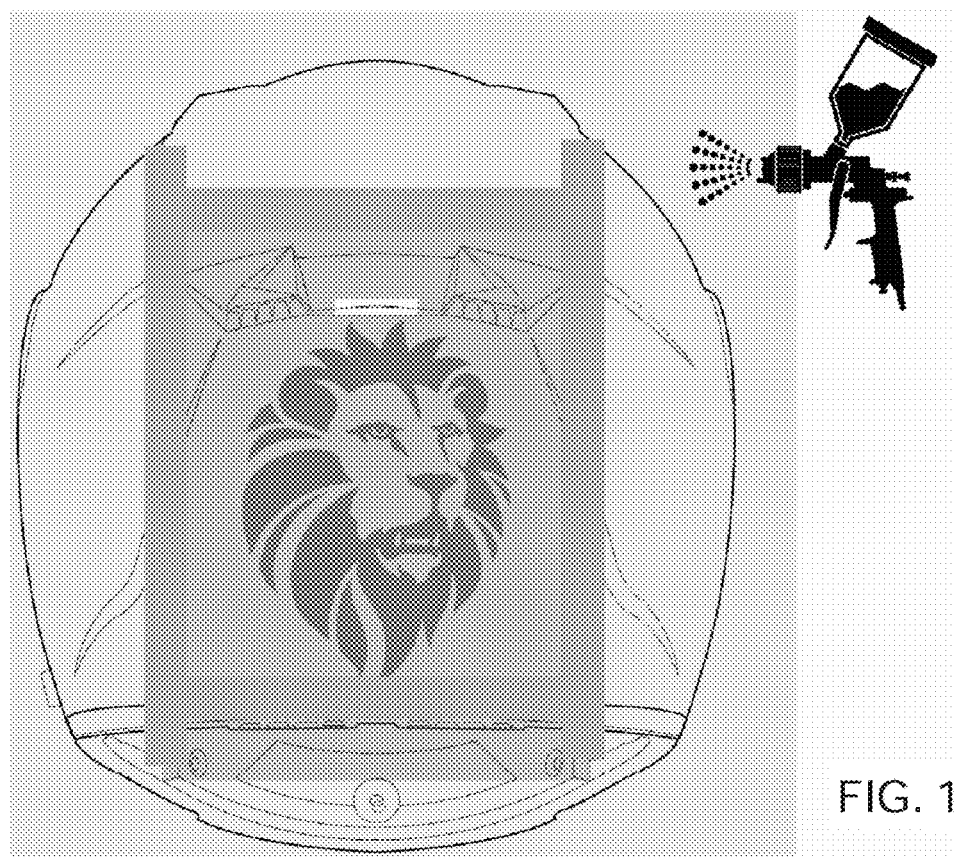
FIG. 10 shows initial application of a diluted color layer.

FIG. 10 shows application of a first layer of color. Preferably, diluted color layer is applied to the "blank" areas.

Figure 11:
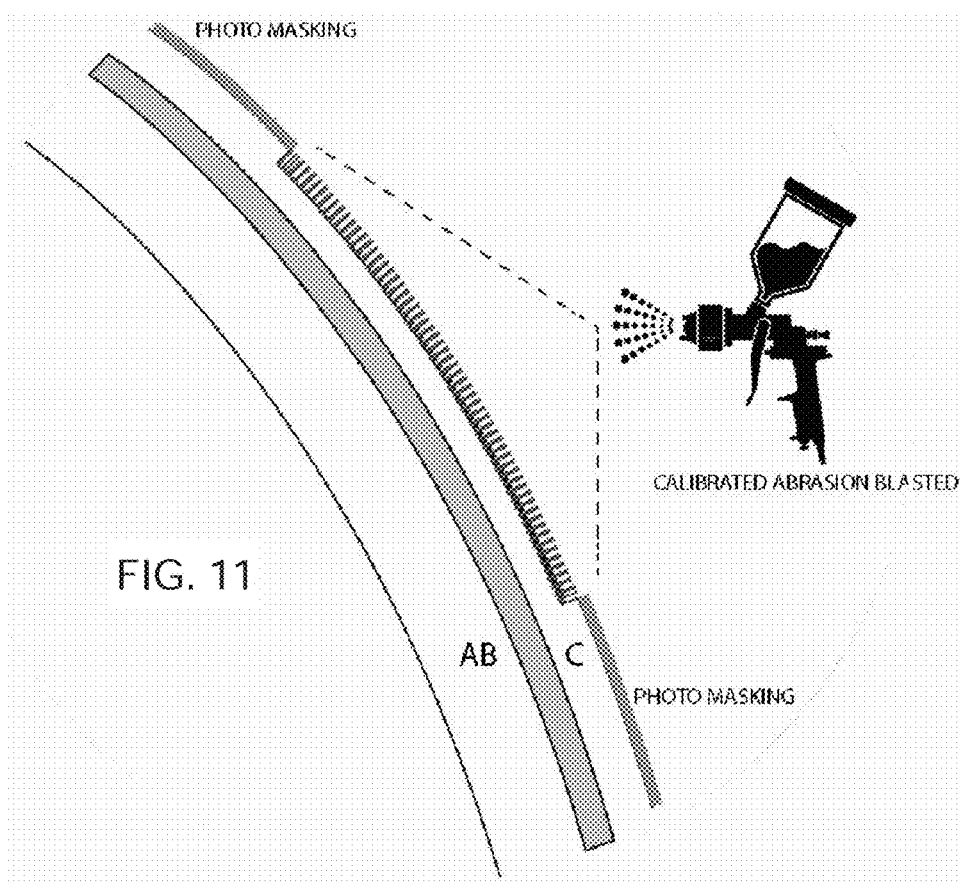
FIG. 11 is a close-up sectional view showing the color layer being added.

FIG. 11 is a close-up cross-section showing where and how the diluted color layer is added.

Figure 12:
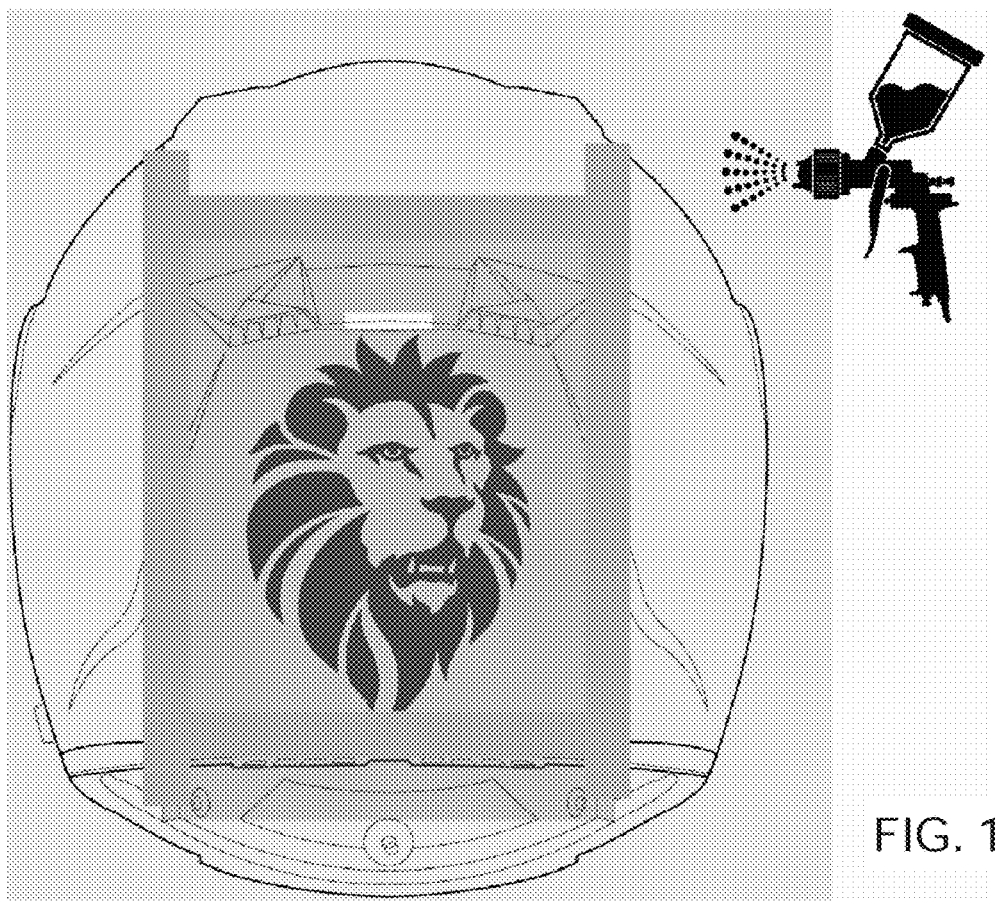
FIG. 12 illustrates application of a full-strength layer of color.

FIG. 12 shows application of the final layer of color. A full-strength layer of color is then applied to give an opaque finish. A lacquer and/or hardener (e.g., 2-part acrylic catalyst) is sometimes added to provide a more durable finish. A clear coat layer/hardener is sometimes also added at this point depending on the final result desired. The paint is applied using a high volume/low pressure system which allows the paint to be sprayed extremely fine so that it can penetrate and adhere to very small areas. Preferably, enough volume of paint is added to bring the depth of the etched portions up to equal with or somewhere close to the surrounding surface of the helmet. With the possible addition of clear coat, the surface finish of the painted areas will be even with the rest of the helmet for a continuous, smooth look.

Figure 13:
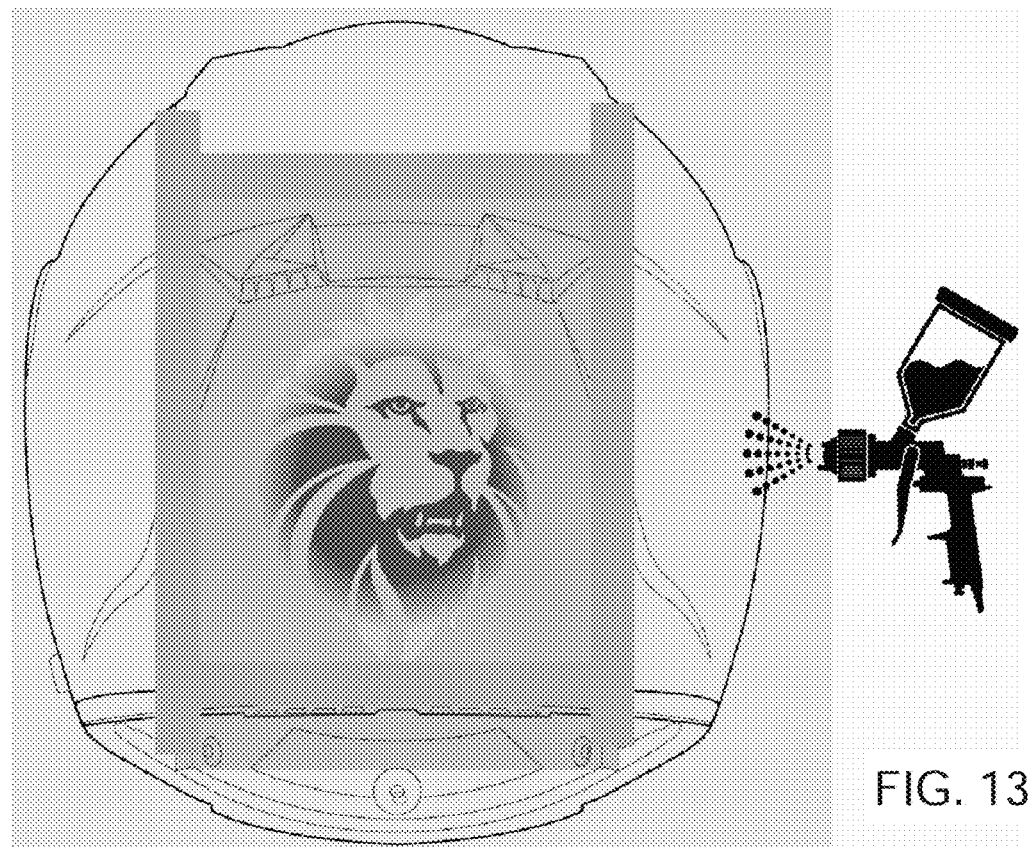
FIG. 13 indicates addition of any special color, flake, or metallic accent.

In FIG. 13, any desired special color, flake, metallic effects, etc. is added.

Figure 14:
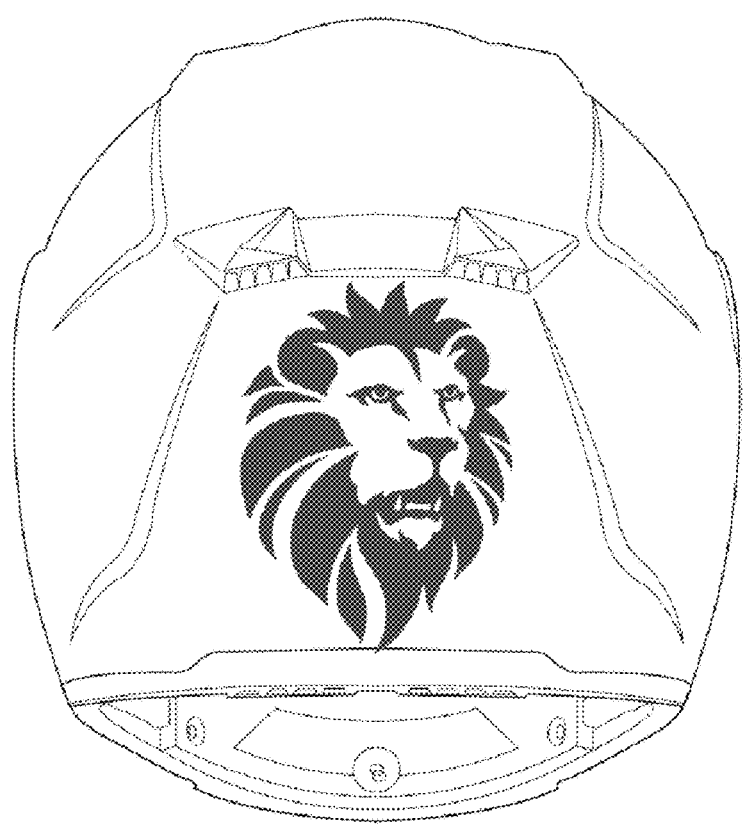
FIG. 14 shows the fully painted helmet after removal of the photoresist film.

Finally, in FIG. 14 the mask is removed carefully with a damp, soft cloth. Preferably, the amount of paint added matches the amount of material that has been removed during the abrading process so that the final surface is even and smooth, as opposed to convex or concave. This can be further controlled by fine polishing of the finished surface.

Figure 15:
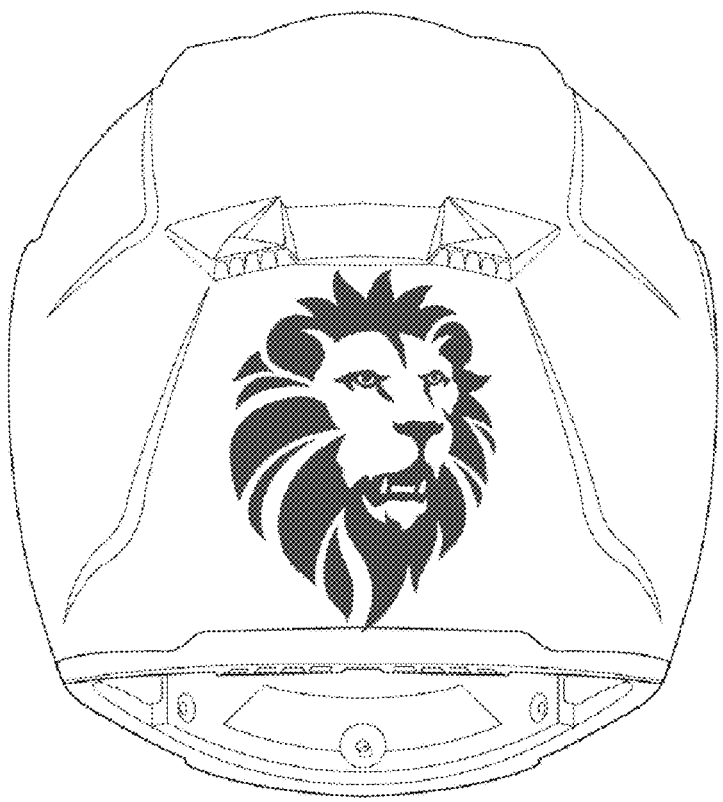
FIG. 15 schematically illustrates light buffering, cleaning, and polishing of the helmet.
Figure 15:
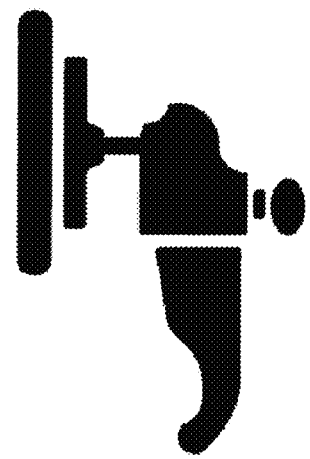

FIG. 15 indicates a light huffing of the helmet with appropriate huffing agents.

Those skilled in the art will appreciate that various changes and modifications may be made to the preferred embodiments, the invention in its broader aspects is not limited to the specific details, representative devices, and illustrative examples shown and described.

It is claimed:

1. A method of forming a design on a helmet, comprising:
applying a design to a clear sheet;
placing the clear sheet against a negative photoresist film to form a masking couple;
exposing the masking couple to UV light to expose and polymerize areas of the negative photoresist film not blocked by the design;
separating the clear sheet from the negative photoresist film;
washing the negative photoresist film with water to remove material within areas of the negative photoresist film that were blocked by the design and create a photoresist mask having an open area in the shape of the design;
without disassembling trim and hardware of a helmet, adhering the photoresist mask to an area on the helmet, the helmet having an existing clear topcoat and paint layer;
securing a protective cover around the helmet except over the photoresist mask;
sandblasting/abrasive-blasting the photoresist mask to etch only portions of the helmet clear topcoat or clear topcoat and paint layer underneath the open area, portions of the existing clear topcoat and paint layer covered by the protective cover not being etched;
applying paint over just the etched portions of the helmet within the open area followed by a clear coat layer/hardener over the paint, the existing clear topcoat and paint layer other than the portions that have been etched being unpainted, and wherein an amount of paint added matches an amount of material that has been removed during the sandblasting/abrasive-blasting process so that a final surface of the helmet is even and smooth from unpainted to painted portions; and
removing the protective cover and photoresist mask from the helmet.

2. The method of claim 1, wherein the negative photoresist film is stretchable.

3. The method of claim 2, wherein the negative photoresist film is self-adhesive.

4. The method of claim 1, wherein the negative photoresist film is self-adhesive.

5. The method of claim 1, wherein the sandblasting/abrasive-blasting is done with silica.

6. The method of claim 1, wherein securing a protective cover around the helmet is done by placing the helmet in a sealed thick plastic protective bag with the area around the photoresist mask cut out and taped to the photoresist mask.

7. The method of claim 1, further including applying a layer of bonding agent to the etched portions prior to the step of applying paint to the etched portions.

8. The method of claim 7, wherein the step of applying paint to the etched portions is done while the bonding agent is still wet.

9. The method of claim 7, further including applying special color, flake, or metallic effects over the paint.

10. The method of claim 1, wherein the step of applying paint to the etched portions includes first applying a diluted color layer and then applying a final layer of color to the diluted color layer.

11. A method of forming a design on a helmet, comprising:
providing a photoresist mask having an open area in the shape of a design;
without disassembling trim and hardware of a helmet, adhering the photoresist mask to an area on the helmet and applying tape to edges of the photoresist mask, the helmet having an existing clear topcoat and paint layer;
securing a protective cover around the helmet except over the photoresist mask and applying tape to edges of the protective cover surrounding the photoresist mask;
sandblasting/abrasive-blasting the photoresist mask to etch only portions of the helmet clear topcoat and paint layer underneath the open area to a predetermined depth at least into the clear topcoat on the helmet, portions of the existing clear topcoat and paint layer covered by the protective cover not being etched;
applying a layer of bonding agent to the etched portions;
applying paint mixed with a hardener over just the etched portions of the helmet within the open area followed by a clear coat layer/hardener over the paint, the existing clear topcoat and paint layer other than the portions that have been etched being unpainted, and wherein an amount of paint added matches an amount of material that has been removed during the sandblasting/abrasive-blasting process so that a final surface of the helmet is even and smooth from unpainted to painted portions; and
removing the protective cover and photoresist mask from the helmet.

12. The method of claim 11, wherein the negative photoresist film is stretchable.

13. The method of claim 12, wherein the negative photoresist film is self-adhesive.

14. The method of claim 11, wherein the sandblasting/abrasive-blasting is done with silica.

15. The method of claim 11, wherein securing a protective cover around the helmet is done by placing the helmet in a sealed thick plastic protective bag with the area around the photoresist mask cut out and taped to the photoresist mask.

16. The method of claim 11, wherein the step of applying paint includes applying a diluted color layer over the bonding agent within the etched portions, and then applying a final layer of color to the diluted color layer.

17. The method of claim 16, wherein the clear coat layer/hardener is applied over the final layer of color.

18. The method of claim 17, further including applying special color, flake, or metallic effects over the paint prior to applying clear coat layer/hardener.

19. The method of claim 11, wherein the step of providing a photoresist mask comprises:

applying a design to a clear sheet;

placing the clear sheet against a negative photoresist film to form a masking couple;

exposing the masking couple to UV light to expose and polymerize areas of the negative photoresist film not blocked by the design;

separating the clear sheet from the negative photoresist film;

washing the negative photoresist film with water to remove material within areas of the negative photoresist film that were blocked by the design and create a photoresist mask having an open area in the shape of the design.

20. The method of claim 19, wherein after the step of washing the photoresist mask has a continuous clear backing layer across both exposed and unexposed areas.

* * * * *